United States Patent [19]
Zheng

[11] Patent Number: 6,157,560
[45] Date of Patent: Dec. 5, 2000

[54] MEMORY ARRAY DATAPATH ARCHITECTURE

[75] Inventor: Hua Zheng, Fremont, Calif.

[73] Assignee: Winbond Electronics Corporation, Hsin Chu, Taiwan

[21] Appl. No.: 09/236,509

[22] Filed: Jan. 25, 1999

[51] Int. Cl.[7] .................................................. G11C 5/06
[52] U.S. Cl. .................... 365/63; 365/51; 365/230.03; 365/230.02
[58] Field of Search ................................. 365/63, 51, 52, 365/230.03, 230.02

[56] References Cited

U.S. PATENT DOCUMENTS

| | | | |
|---|---|---|---|
| 5,940,329 | 8/1999 | Seitsinger et al. | 365/230.03 |
| 5,949,697 | 7/1999 | Lee | 365/51 |
| 5,959,918 | 9/1999 | Arimoto | 365/205 |
| 5,995,404 | 11/1999 | Nakaumura et al. | 365/63 |

Primary Examiner—Huan Hoang
Attorney, Agent, or Firm—Dinh & Associates

[57] ABSTRACT

A datapath structure (for use in conjunction with at least one memory array) that includes N local data lines, N global data lines, M global I/O lines, and a datapath. Each memory array is partitioned into a number of segments, and each segment is associated with one or more bit lines. Each segment is further associated with at least one local data line. Each local data line couples to the bit lines associated with that particular local data line. The N global data lines operatively couple to the N local data lines. The datapath interconnects the N global data lines to the M global I/O lines in accordance with a set of control signals. The datapath includes M local I/O lines, M multiplexer circuits, and M interface circuits. The M interface circuits interconnect the M global I/O lines and the M local I/O lines. Each of the M multiplexer circuits interconnects the M local I/O lines to N/M of the N global data lines. In a specific implementation, M is eight and N is sixty-four.

33 Claims, 9 Drawing Sheets

MEMORY ARRAY DATAPATH ARCHITECTURE

BACKGROUND OF THE INVENTION

The present invention relates generally to memory devices, and more particularly to a memory array datapath architecture.

Memory devices are integral to a computer system, and to many electronic circuits. Continuous improvements in the operating speed and computing power of a central processing unit (CPU) enable operation of an ever-greater variety of applications, many of which require faster and larger memories. Larger memories can be obtained by shrinking the geometry of the memory cells and data lines within the memory devices.

With the larger memory, the memory device typically includes many device input/output (I/O) pins to support the concurrent access of many data bits to and from the device. These I/O pins are interconnected to all memory cells within the memory device through a structure of interconnections (also referred to as a datapath structure). As the number of I/O pins increases and as the number of memory cells in the memory device grows, the datapath structure also grows in complexity.

The memory device is also typically designed to support multiple modes of operation, such as normal write, block write, and read operations. These various operating modes are necessary to provide the required functionality. In a normal write operation, M data bits from M device I/O pins are provided to M memory cells. In a block write operation, multiple data bits can be written to many memory cells. A particular bit in a block write can be written to one or more memory cells depending on the particular design of the memory device or the state of the control signals, or both. For a block write, the data bits are typically provided by a set of registers located within the memory device and the masking information is provided from the I/O pins. The masking information determines which ones of the memory cells are to be written. And in a read operation, M data bits from M memory cells are retrieved and provided to M device I/O pins.

The large number of device I/O pins and memory cells, together with the requirement to support multiple operating modes, typically result in a complex datapath structure. In fact, the design of a datapath structure that supports the various operating modes and provides the most interconnection flexibility is typically one of the most tedious task in the design of the memory device.

To support the various operating modes and to provide interconnection flexibility, additional internal data lines and multiplexers are typically provided in the datapath structure. The additional circuitry, while increasing flexibility, results in a larger circuit die area and increased cost. The increased die area is essentially a "die penalty" for the additional flexibility. Further, the additional circuitry compounds the complexity of the datapath structure, which often leads to a longer design cycle.

As can be seen, a datapath architecture that provides flexible interconnections and supports a wide variety of operating modes while incurring minimal die and cost penalties is highly desirable.

SUMMARY OF THE INVENTION

The invention provides an interconnecting (or datapath) structure that supports concurrent access of multiple data bits from multiple memory cells through multiple device input/output (I/O) pads. The invention provides interconnection flexibility for many operating modes while minimizing the amount of required circuitry. The invention achieves this by partitioning a memory array into segments and providing one or more local data lines for each segment. Additional advantages are obtained by providing a set of local I/O lines within the datapath structure that enhances the interconnections between the I/O pads and the local data lines. The invention provides many advantages over conventional datapath structures while incurring a small "die penalty."

A specific embodiment of the invention provides a datapath structure for an integrated circuit that includes at least one memory array. The datapath structure includes N local data lines, N global data lines, M global I/O lines, and a datapath. Each memory array is partitioned into a number of segments, and each segment is associated with one or more bit lines. Each segment is further associated with at least one local data line. Each local data line couples to the bit lines associated with that particular local data line. The N global data lines operatively couple to the N local data lines. The datapath interconnects the N global data lines to the M global I/O lines in accordance with a set of control signals. In a specific implementation, M is eight and N is sixty-four.

In a specific embodiment, the datapath includes M local I/O lines, M multiplexer circuits, and M interface circuits. The M interface circuits interconnect the M global I/O lines and the M local I/O lines. Each of the M multiplexer circuits interconnects the M local I/O lines to a different set of N/M global data lines. The interface circuits and multiplexer circuits provide signal multiplexing, buffering, and signal drive. The local I/O lines provide interconnection flexibility for the datapath while reducing the amount of required circuitry.

The invention supports various memory access operations, including normal write, block write, and read operations. Further, for each of these memory access operations, the invention supports a single data rate (SDR) and a double data rate (DDR) operation. The read and write operations can be initiated upon receiving the necessary data bits and, for a block write, the necessary masking information.

The foregoing, together with other aspects of this invention, will become more apparent when referring to the following specification, claims, and accompanying drawings.

DESCRIPTION OF THE SPECIFIC EMBODIMENTS

For clarity, the invention is described for a specific implementation of a memory device. However, the specific details are intended to be illustrative, and not limitations, of the present invention. It will be recognized that alternative implementations of the invention and modifications of the architectures described herein can be made (i.e., to satisfy a particular design requirement), and these variations are all within the scope of the invention.

Figure 1:
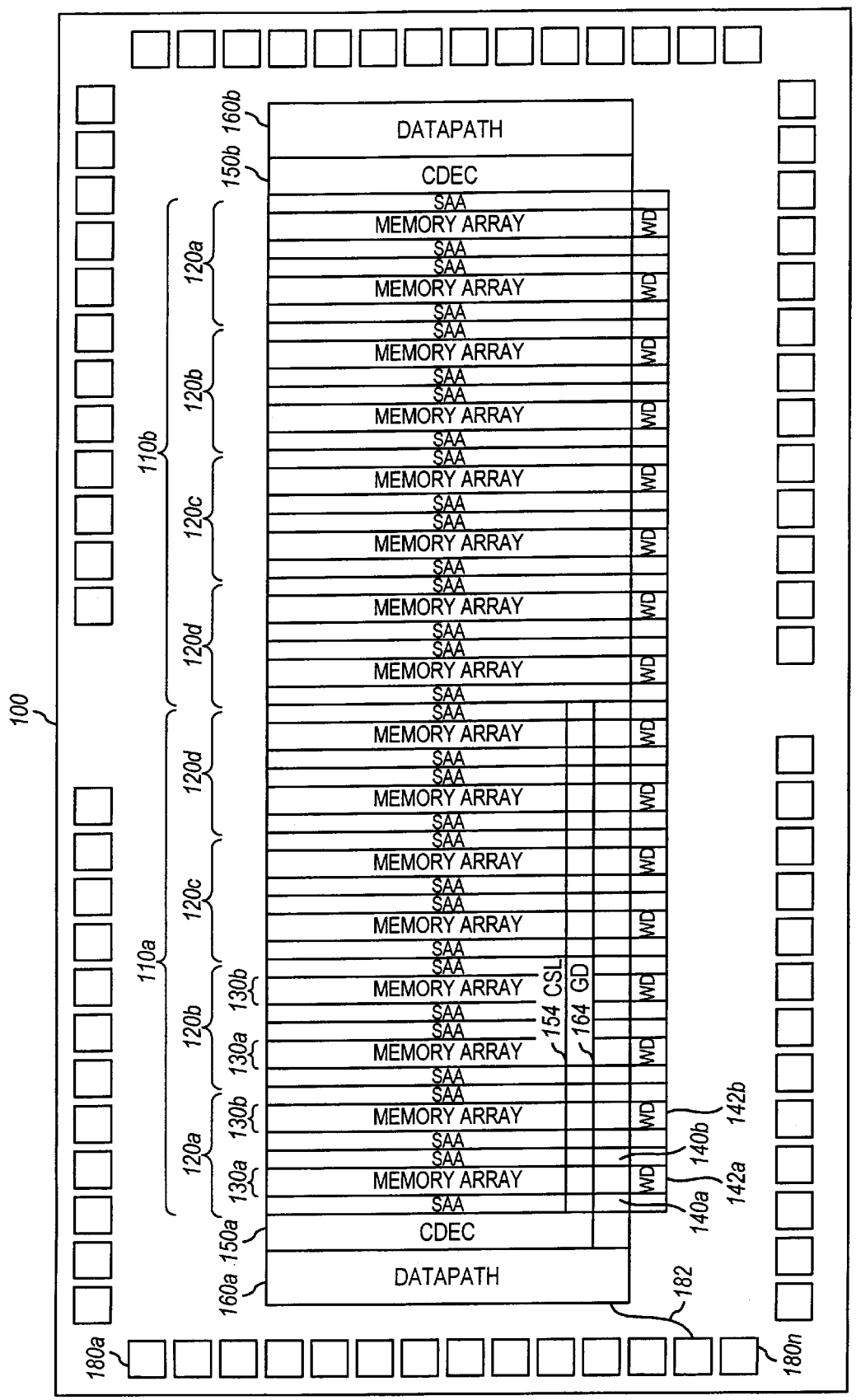
FIG. 1 shows a diagram of a specific embodiment of a memory device.

FIG. 1 shows a diagram of a specific embodiment of a memory device 100. As shown in FIG. 1, memory device 100 includes two memory blocks 110a and 110b. Each memory block 110 includes four memory banks 120a through 120d, each memory bank 120 includes two memory arrays 130a and 130b, and each memory array 130 is associated with two sense amplifier arrays (SAAs) 140. Generally, the memory device can include greater or fewer number of memory blocks, each memory block can include greater or fewer number of memory banks, and each memory bank can include greater or fewer number of memory arrays than that shown in FIG. 1. As an example, memory device 100 can be a 64-Mbit DRAM device having four memory blocks, with each memory block including eight memory banks and each memory bank including two memory arrays, whereby each memory array includes one million bit (Mbits) of memory. As another example, memory device 100 can be a 256-Mbit DRAM device having four memory blocks, with each memory block including eight memory banks and each memory bank including four memory arrays, whereby each memory array includes two Mbits of memory.

Each memory array 130 includes memory cells for many data bits. The memory cells are typically arranged in a two-dimensional array. A word line signal (WL) selects a particular row within the memory array, and a column select line (CSL) 154 selects a particular column. In a specific embodiment, each memory array 130 includes 512 columns and 512 word lines (plus some redundant columns and word lines). A word ine driver (WD) 142 associated with each memory array 130 activates the WLs for that memory array. In the embodiment shown in FIG. 1, the CSLs for memory block 110a are activated by a column decoder (CDEC) 150a and the CSLs for memory block 110b are activated by a column decoder 150b. The WLs and CSLs are activated in accordance with a memory address provided by a source external or internal to memory device 100.

A datapath 160a interconnects the memory cells in memory block 110a to one set of input/output (I/O) pads 180, and a datapath 160b interconnects the memory cells in memory block 10b to another set of I/O pads 180. Datapath 160a couples to a set of global data lines (GD) 164 that traverses through the memory arrays in memory block 110a. Datapath 160a further couples to I/O pads 180 via a set of pad lines 182. Memory device 100 typically includes many global data lines 164 and many pad lines 182. However, for clarity, only one of each is shown in FIG. 1. Through I/O pads 180 and datapath 160, the input data bits and addresses are provided to, and the stored data bits are retrieved from, memory cells within memory device 100. The datapath structure is described in greater detail below. As use herein, the "datapath structure" includes all signal lines and circuitry that interconnect the I/O pads to the memory cells within the memory device.

Additional control and support circuitry is dispersed through memory device 100. The control and support circuitry include circuits that generate reference voltages, circuits that generate clock signals, circuits that provide control signals for various functional blocks within memory device 100, and so on. Some of these circuits are described below, as necessary for the understanding of the invention.

Figure 2:
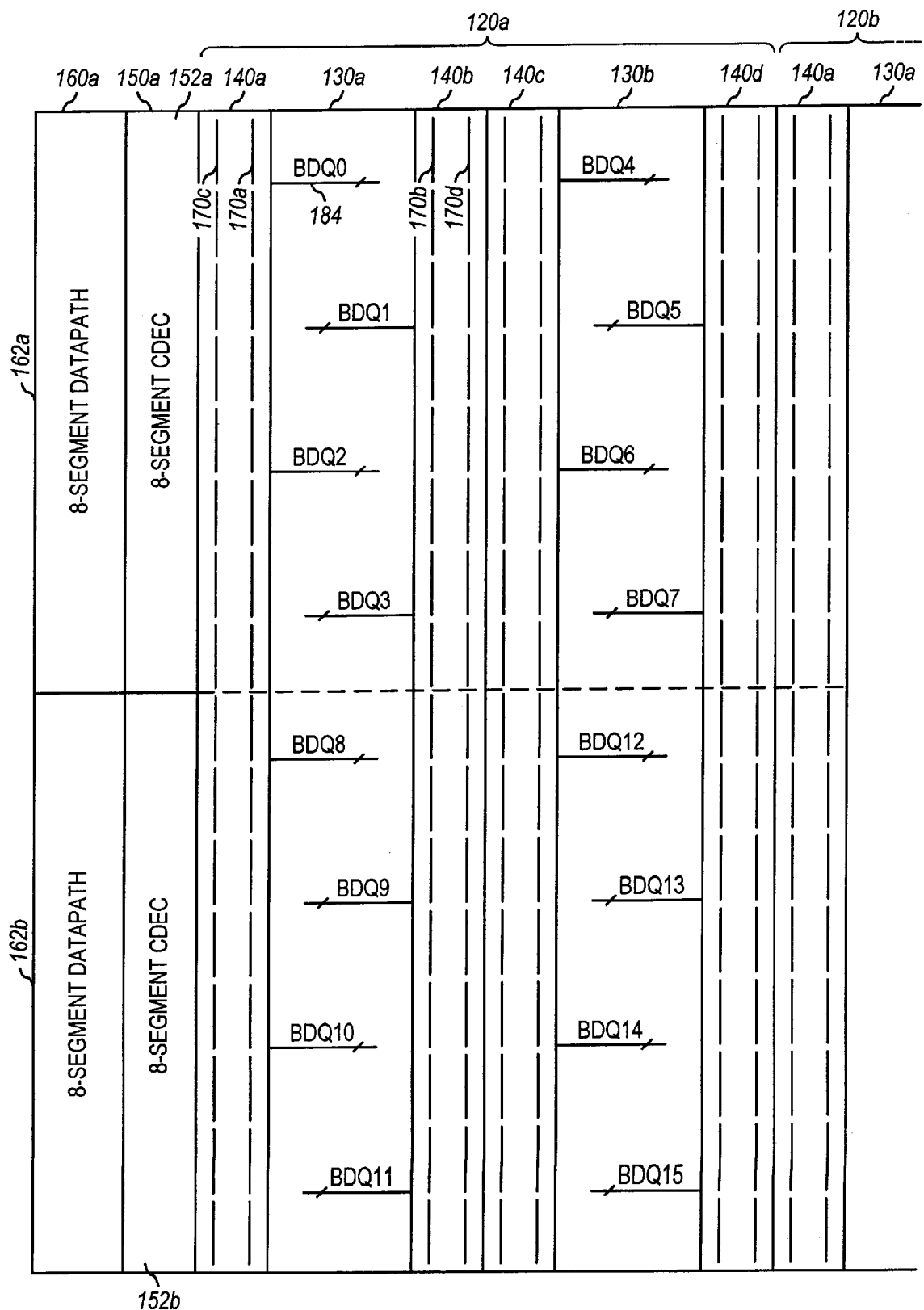
FIG. 2 shows a diagram of a specific embodiment of a segmented memory array.

FIG. 2 shows a diagram of a specific embodiment of a segmented memory array. As shown in FIGS. 1 and 2, memory bank 120a includes two memory arrays 130a and 130b. Memory array 130a is associated with sense amplifier arrays 140a and 140b, and memory array 130b is associated with sense amplifier arrays 140c and 140d. In a specific embodiment, each sense amplifier array 140 is partitioned into sixteen segments. In a specific embodiment, each segment is associated with a pair of local data lines (LD) 174. Each local data line 174 couples to the bit lines (BLs) in the segment associated with that particular local data line. Collectively, each sense amplifier array 140 includes a total of 32 local data lines 174. Since there are four sense amplifier arrays 140 in each memory bank 120, and each sense amplifier array 140 includes sixteen pairs of local data lines 174, a total of 128 local data lines 174 are provided for each memory bank 120. In an embodiment, each local data line 174 is associated with a corresponding global data line 164 (which is not shown in FIG. 2).

Each bit line, when activated, couples to a particular I/O pad (or DQ pad). In the specific embodiment shown in FIG. 2, the bit lines in the upper half of memory arrays 130a and 130b couple to DQ pads (0) through (7), and the bit lines in the lower half of memory arrays 130a and 130b couple to DQ pads (8) through (15). The bit lines that can couple to DQ pad (0) are collectively labeled as BDQ0. In the specific embodiment shown in FIG. 2, the bit lines for the even numbered DQ pads are coupled to the sense amplifier array located to the left of the memory array, and the bit lines for the odd numbered DQ pads are coupled to the sense amplifier array located to the right of the memory array. Further, in the upper half, the bit lines for the lower numbered DQ pads (e.g., DQ(0) through DQ(3)) are coupled to sense amplifier arrays 140a and 140b associated with the left memory array 130a in the memory bank, and the bit lines for the higher numbered DQ pads (e.g., DQ(4) through DQ(7)) are coupled to sense amplifier arrays 130c and 140d associated with the right memory array 130b.

As shown in FIG. 2, column decoder 150a is partitioned into two 8-segment column decoders 152a and 152b that provide the CSLs for the upper and lower halves of the memory arrays, respectively. Similarly, datapath 160a is partitioned into two 8-segment datapaths 162a and 162b. Each datapath 162 includes the interconnections and support circuitry for eight segments of the memory arrays. For example, datapath 162a supports segments (0) through (7) in the upper half of the memory block, and datapath 162b supports segments (8) through (15) in the lower half of the memory block. Datapath 162 is further described below.

In conventional memory architectures, the local data lines typically traverse the length of the sense amplifier array. However, as shown in FIG. 2, each local data line 174 traverses approximately the length of the segment (i.e., a portion of the length of the memory array) or approximately 1/16 of the length of a conventional local data line. The total length of all 32 local data lines 174 in each sense amplifier array 140 is thus approximately equal to the total length of two conventional local data lines. Implementation of local data lines 174 requires minimal additional die area more than that of a conventional memory array. Thus, the segmented memory array architecture shown in FIG. 4 experiences a small "die-penalty," if any.

The segmented memory array architecture is further described in U.S. patent application Ser. No. 09/195,269, entitled "MEMORY ARRAY ARCHITECTURE FOR MULTI-DATA RATE OPERATION," filed Nov. 18, 1998, and application Ser. No. 09/235,222, entitled "MEMORY ARRAY ARCHITECTURE SUPPORTING BLOCK WRITE OPERATION," filed Jan. 22,1998, both assigned to the assignee of the present invention and incorporated herein by reference.

As shown in FIGS. 1 and 2, each memory array 130 is associated with two sense amplifier arrays 140 that include the sensing amplifier circuits for sensing the bit lines. Typically, one sense amplifier (SA) is included in sense amplifier array 140 for each bit line.

For improved performance, the bit lines and the internal data lines before the data is sensed (e.g., bit lines 184, local data lines 174, and global data lines 164) are each implemented with a complementary line pair (e.g., BL and BL/). However, for simplicity, a complementary line pair is generically referred to as a "line" in this specification. To increase the number of memory cells that can be populated on a memory array, the spacing between the complementary bit line pair, and between adjacent bit lines, is reduced to very fine line spacing. The fine line spacing can render it impractical to implement the sense amplifiers on only one side of the memory array. Consequently, the sense amplifiers are typically distributed on both sides of the memory array. In one implementation, the sense amplifiers are alternated on both sides of the memory array such that the sense amplifiers for the odd numbered bit lines are located on one side of the memory array and the sense amplifiers for the even numbered bit lines are located on the other side. This configuration effectively doubles the available area to implement each sense amplifier. To reduce the number of required sense amplifiers, the amplifiers may be shared by adjacent memory arrays, provided the appropriate control circuits and control signals are made available.

Figure 3A:
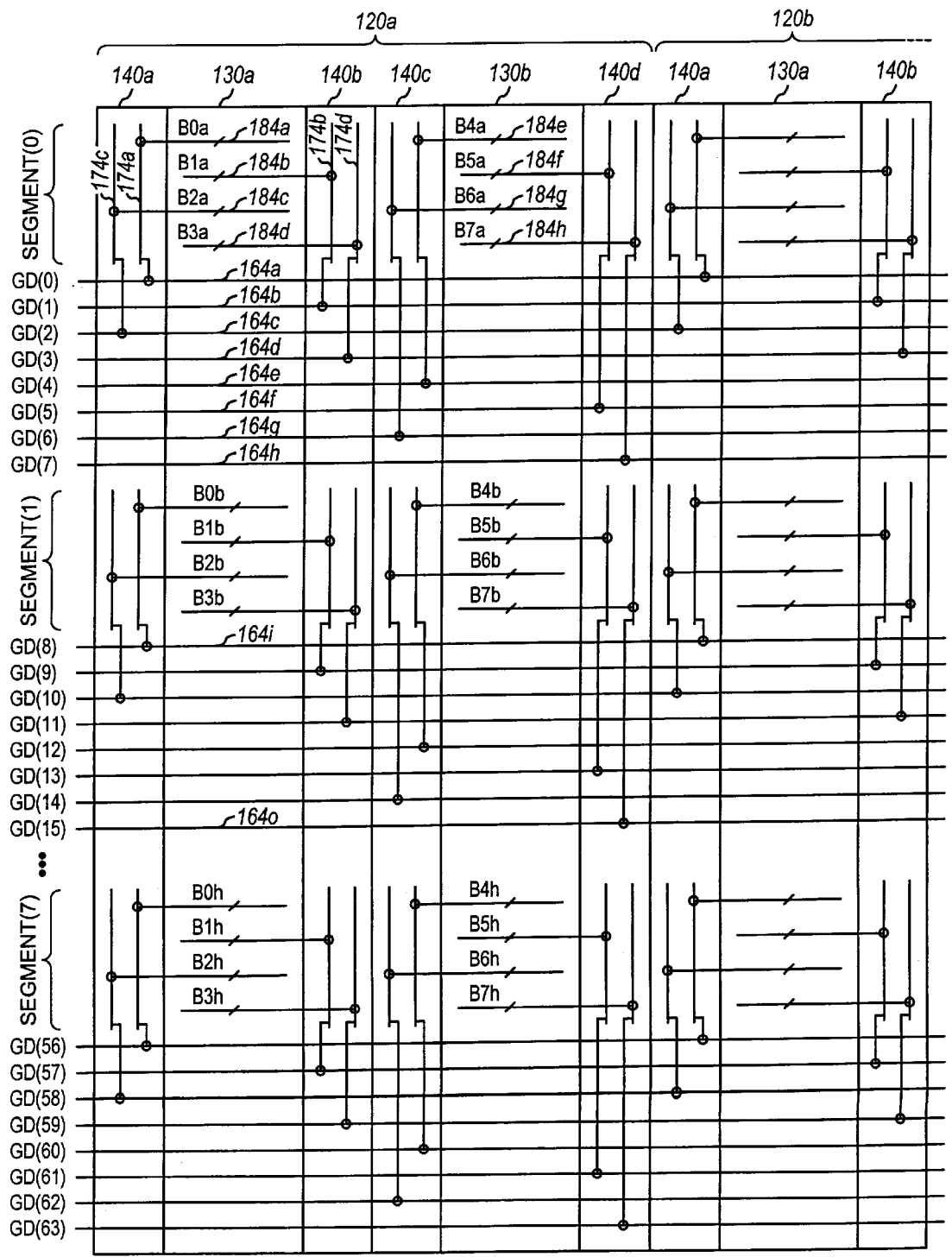
FIG. 3A shows a diagram of a specific embodiment of the interconnections between the global data lines, the local data lines, and the bit lines within a memory bank.

FIG. 3A shows a diagram of a specific embodiment of the interconnections between global data lines 164, local data lines 174, and bit lines 184 within memory bank 120. As noted above, each memory bank 120 includes two memory arrays 130*a* and 130*b* and four sense amplifier arrays 140*a* through 140*d*. Also, as noted above, in a specific embodiment, each sense amplifier array 140 is partitioned into sixteen segments, and each segment is associated with a pair of local data lines 174. Thus, each memory bank 120 includes a total of 128 local data lines 174. Since each local data line 174 is associated with one global data line 164 in a specific embodiment, a total of 128 global data lines 164 are provided for memory bank 120. FIG. 3A shows the interconnections of the data lines for the upper half of memory bank 120*a*. The interconnections of the data lines for the lower half of memory bank 120*a* is substantially similar.

As shown in FIG. 3A, a first set of eight global data lines 164*a* through 164*h* (labeled as GD(0) through GD(7)) traverses through the memory arrays. Global data line 164*a* couples to local data line 174*a* in segment (0) of sense amplifier arrays 140*a*. Local data line 174*a* further couples to a set of bit lines 184*a* (which is labeled as B0*a*). In the specific embodiment, each memory array 130 includes 512 columns and 512 bit lines. Since there are a total of 128 local data lines 174, each local data line 174 couples to four bit lines. Similarly, global data line 164*b* couples to local data line 174*b* in segment (0) of sense amplifier array 140*b*. Local data line 174*b* further couples to a set of bit lines 184*b* (which is labeled as B1*a*). Global data line 164*c* couples to local data line 174*c* in segment (0) of sense amplifier array 140*a* that further couples to a set of bit lines 184*c* (which is labeled as B2*a*). And global data line 164*d* couples to local data line 174*d* in segment (0) of sense amplifier array 140*b* that further couples to a set of bit lines 184*d* (which is labeled as B3*a*).

Global data lines 164*e* through 164*h* couple to respective local data lines 174*e* through 174*h* within sense amplifier arrays 140*c* and 140*d* in similar manner as for global data lines 164*a* through 164*d*. Thus, for segment (0) of memory bank 120*a*, eight global data lines 164 couple to eight local data lines 174.

Segment (1) is associated with a second grouping of bit lines that is coupled to a second set of global data lines 164*i* through 164*o* (labeled as GD(8) through GD(15)). The interconnections of GD(8) through GD(15) in segment (1) are similar to those of GD(0) through GD(7) in segment (0). The interconnections between the global data lines and the local data lines are similarly repeated for the remaining segments. Thus, segment (7) is associated with the eighth grouping of bit lines that couples in similar manner to the eighth set of global data lines GD(56) through GD(63).

As shown in FIG. 3A, the interconnections between the set of global data lines and their associated local data lines for each of the eight segments in the upper half are substantially similar. Also, as shown in FIG. 3A, global data lines 164 couple to the local data lines of other memory banks 120 within the same memory block 110 in similar manner as for memory bank 120*a*. For example, the interconnections between global data lines 164 and local data lines 174 are similar for segment (0) of sense amplifier array 140*a* of memory banks 120*a*, 120*b*, and so on.

In FIG. 3A, the set of bit lines B0*a* is a subset of the set of bit lines BDQ0 shown in FIG. 2. In fact, BDQ0 in FIG. 2 includes the bit lines from B0a, B0b, through B0*h*.

As will be shown below in greater detail below, global data lines 164*a* through 164*h* corresponding to GD(0) through GD(7) can provide eight data bits to eight different I/O pads. Segment (0) of memory array 130*a* is associated with bit lines that can be coupled to four different I/O pads, and segment (0) of memory array 130*b* is associated with bit lines that can be provided to another four different I/O pads.

Figure 3B:
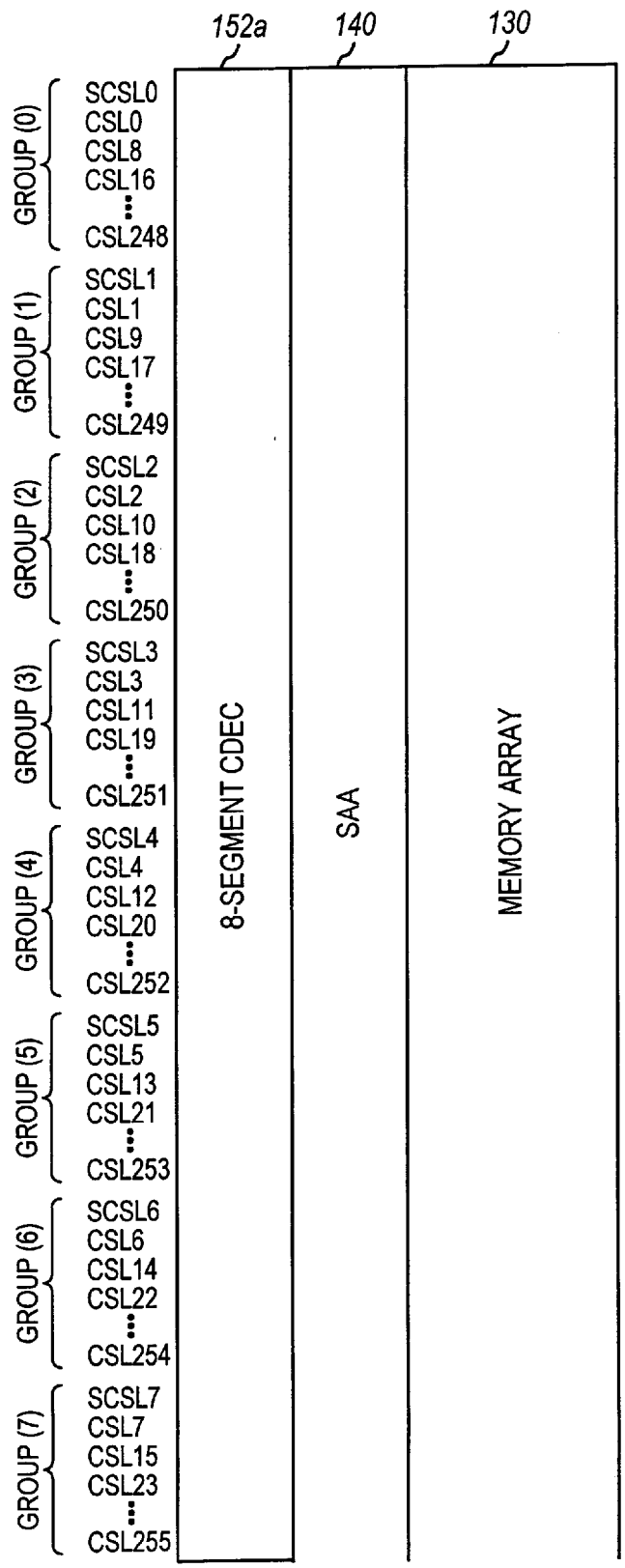
FIG. 3B shows a diagram of a specific embodiment of a mapping of the column select lines (CSLs) that enhances the block write capability.

FIG. 3B shows a diagram of a specific embodiment of a mapping of the CSLs that enhances the block write capability. As noted above, in the specific embodiment, each memory array 130 includes 512 CSLs that are activated by column decoder (CDEC) 150. Column decoder 150 includes decoding logic for sixteen segments, with 8-segment column decoder 152*a* including the decoding logic for the upper eight segments (0) through (7) and 8-segment column decoder 152*b* (not shown in FIG. 3B) including the decoding logic for the lower eight segments. The CSLs from 8-segment column decoder 152*a* are distributed into eight groups such that each group includes CSLs that are spaced by eight apart. For example, group (0) includes CSL(0), CSL(8), through CSL(248). In the implementation shown in FIG. 3B, each group also includes a spare CSL (SCSL) that provides redundancy. The arrangement of the CSLs into groups allows for a block write of eight data bits to eight consecutively numbered CSLs located in eight different segments. This arrangement also allows for a block write of eight data bits to the same segment. The implementation of column decoder 152 is known in the art and not described herein.

Figure 4:
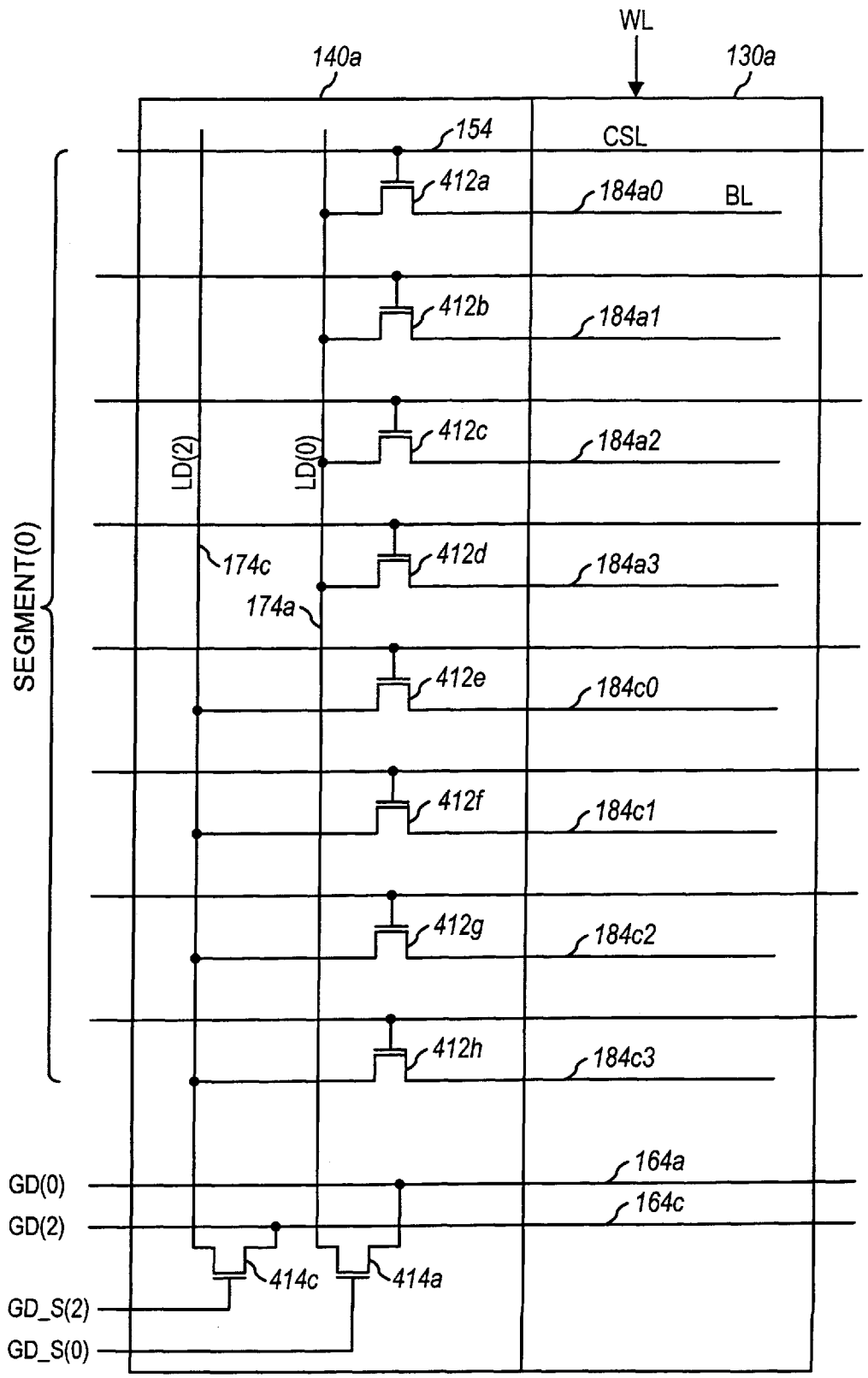
FIG. 4 shows a schematic diagram of a specific embodiment of the interconnections within one segment of one sense amplifier array associated with a memory array.

FIG. 4 shows a schematic diagram of a specific embodiment of the interconnections within one segment of one sense amplifier array associated with a memory array. In particular, FIG. 4 shows the data lines and circuitry for sense amplifier array 140a associated with memory array 130a. The data lines and circuitry for sense amplifier array 140b (which is also associated with memory array 130a) are not shown for simplicity, but would generally be the mirror image of that shown in FIG. 4. Within segment (0), a number of CSLs 154 traverses through memory array 130a and sense amplifier array 140a. Typically, one CSL 154 is provided for one or more bit lines 184. Each CSL 154 couples to the gate of a pass transistor 412 (which is implemented as an N-channel transistor). The source of transistor 412 couples to one local data line 174 and the drain of transistor 412 couples to one bit line 184. The complementary bit lines and their associated pass transistors are not shown in FIG. 4 for clarity.

Within segment (0), local data line 174a couples to all bit lines 184a0 through 184a3 associated with that local data line via transistors 412a through 412d, respectively. Similarly, local data line 174c couples to all bit lines 184c0 through 184c3 associated with that local data line via transistors 412e through 412h, respectively. Bit lines 184a0 through 184a3 correspond to the set of bit lines 184a in FIG. 3A, and bit lines 184c0 through 184c3 correspond to the set of bit lines 184c. Each local data line 174 further couples to the source of one coupling transistor 414 (which is also implemented as an N-channel transistor). The gate of transistor 414 couples to a global data line control signal (GD_S) and the drain of transistor 414 couples to one global data line 164. Transistor 414 behaves as a pass transistor that couples the selected local data line 174 (as determined by the control signal GD_S) to an associated global data line 164. Each global data line 164 is also composed of a complementary line pair, but the complementary lines are not shown for clarity.

Global data lines 164 couple to respective sections of datapath 160. Datapath 160 includes secondary sense amplifiers that detect the voltage on local data lines 174 during a read operation, and data drivers that drive local data lines 174 and global data lines 164 during a write operation. Datapath 160 is described in greater detail below.

The architecture shown in FIGS. 3A and 4 allows for concurrent access of four data bits on four I/O pads for each segment of memory array 130. For example, as shown in FIG. 3A, two data bits are accessed through local data lines 174a and 174c in sense amplifier array 140a and two data bits are accessed through local data lines 174b and 174d in sense amplifier array 140b. Access of multiple data bits from the same segment is enabled by the use of multiple local data lines 174.

One aspect of the invention is the arrangement of local data lines 174 and global data lines 164. As shown in FIG. 4, local data lines 174 are arranged in substantially the same orientation as the local data lines for a conventional memory device. The data bits on local data lines 174 are provided to datapath 160 via global data lines 164. Global data lines 164 can be efficiently implemented similar to CSLs 154. Similarly, the control signals (GD_S) can be efficiently implemented with minimal additional die area.

Figure 5:
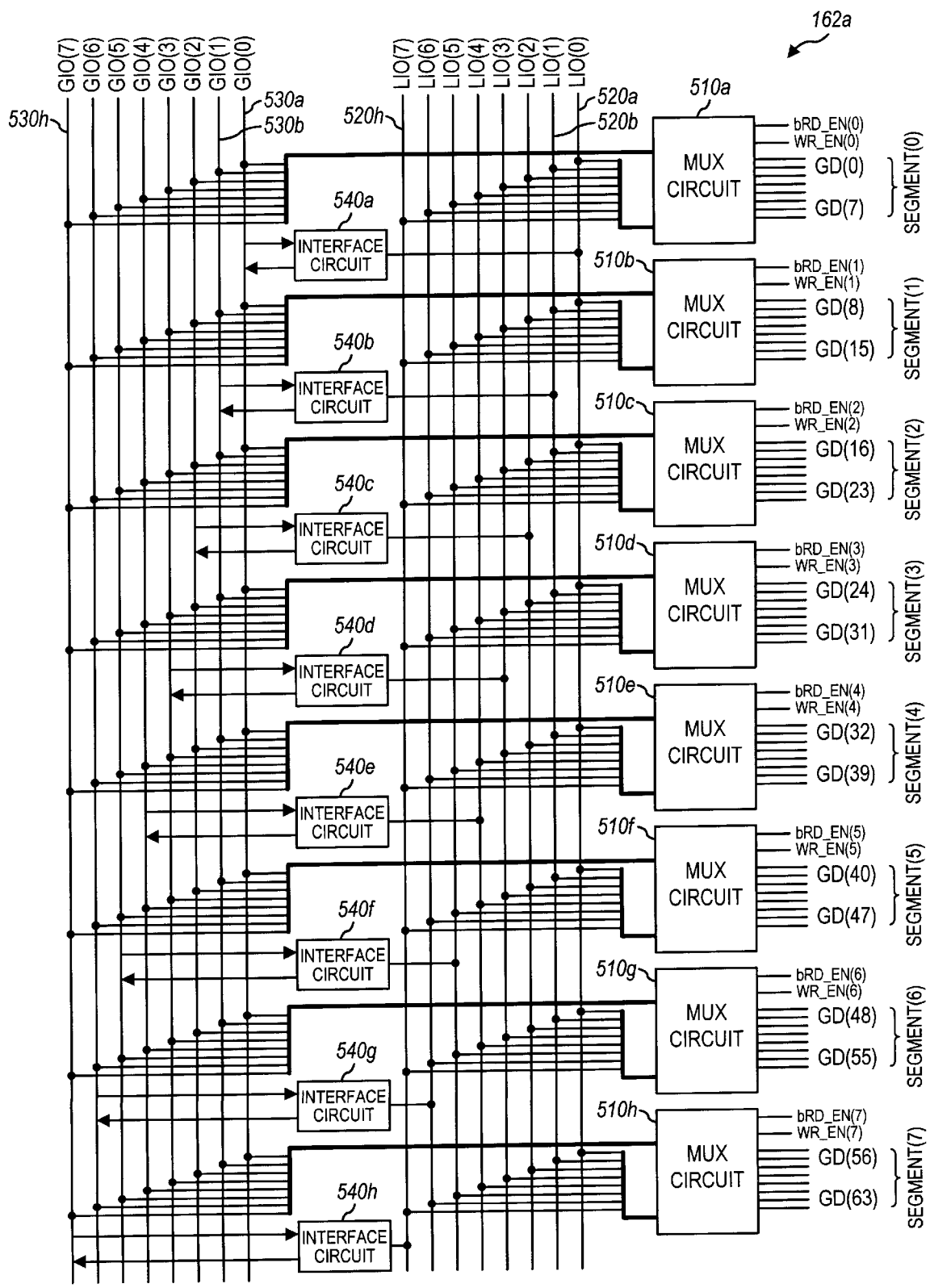
FIG. 5 shows a diagram of a specific embodiment of an 8-segment datapath.

FIG. 5 shows a diagram of a specific embodiment of 8-segment datapath 162. Datapath 162 includes eight multiplexer circuits 510a through 510h, one for each segment, that buffer and route the data bits between the 110 pads and the memory cells. Each multiplexer circuit 510 couples to a local I/O bus 520 (labeled as LIO in FIG. 5) that further couples to a global I/O bus 530 (labeled as GIO in FIG. 5) via a set of interface circuits 540. Global I/O bus 530 couples to I/O pads 180 via pad lines 182 (not shown in FIG. 5).

More particularly, as shown in FIG. 5, each line in global I/O bus 530 couples to a corresponding interface circuit 540. For example, global I/O line 530a couples to interface circuit 540a, global I/O line 530b couples to interface circuit 540b, and so on. Each interface circuit 540 further couples to a corresponding line in local 110 bus 520. For example, interface circuit 540a couples to local I/O line 520a, interface circuit 540b couples to local I/O line 520b, and so on. Local 110 bus 520 couples to all multiplexer circuits 510. Global I/O bus 530 also couples directly to all multiplexer circuits 510. In an embodiment, local I/O bus 520 is "local" to datapath 162 and couples to circuits and buses within datapath 162. In an embodiment, global I/O bus 530 is "global" and traverses to other 8-segment datapaths 162 within a particular datapath 160. Global I/O bus 530 can also interconnect 8-segment datapaths 162 within different datapaths (e.g., datapaths 160a and 160b), although this is not implemented in memory device 100 to reduce interconnection complexity. The operation and interconnections of datapath 162 are described in detail below.

Figure 6:
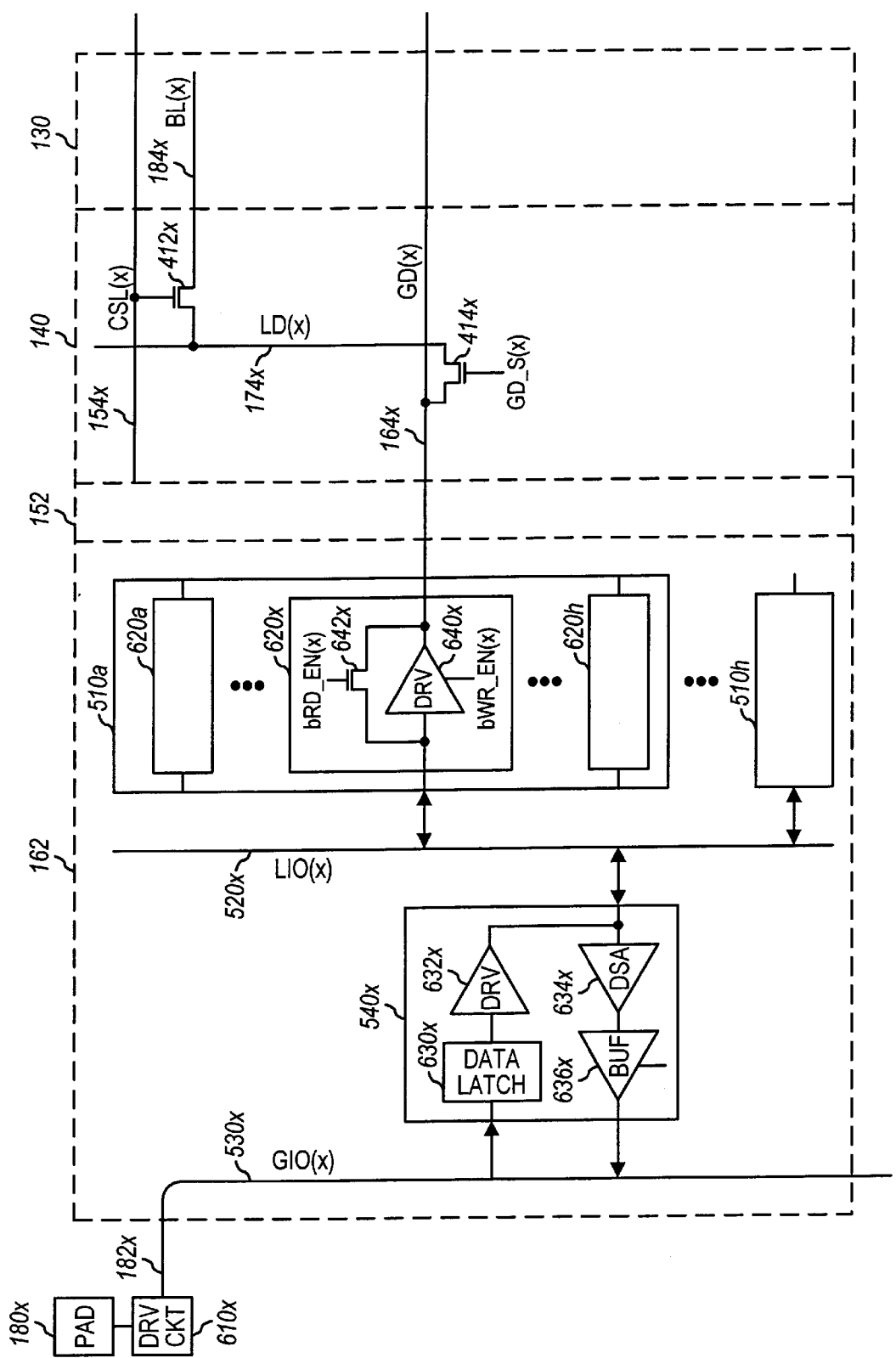
FIG. 6 shows a diagram of a specific embodiment of the interconnections of the datapath structure for a memory access of a single data bit between a single I/O pad and a selected memory cell for read and write operations.

FIG. 6 shows a diagram of a specific embodiment of the interconnections of the datapath structure for a memory access of a single data bit between a single I/O pad and a selected memory cell for read and write operations. Pad 180x couples to a (nearby) driver circuit (DRV CKT) 610x that provides the necessary signal buffering and drive. By locating driver circuit 610x close to pad 180x, performance is improved. Driver circuit 610x further couples to a corresponding global I/O line 530x via a pad line 182x. Global I/O line 530x couples to interface circuit 540x that further couples to local 110 line 520x. Interface circuit 540x buffers the signal and provides the required drive. Specifically, local I/O line 520x couples to one bi-directional multiplexer 620x in each of multiplexer circuits 510a through 510h. Bi-directional multiplexer 620x of multiplexer circuits 510a couples to a corresponding global data line 164x that traverses through the memory arrays within a memory block. At a particular memory array, global data line 164x couples to local data line 174x via coupling transistor 414x. Local data line 174x then couples to a particular bit line 184x via pass transistor 412x.

Figure 7:
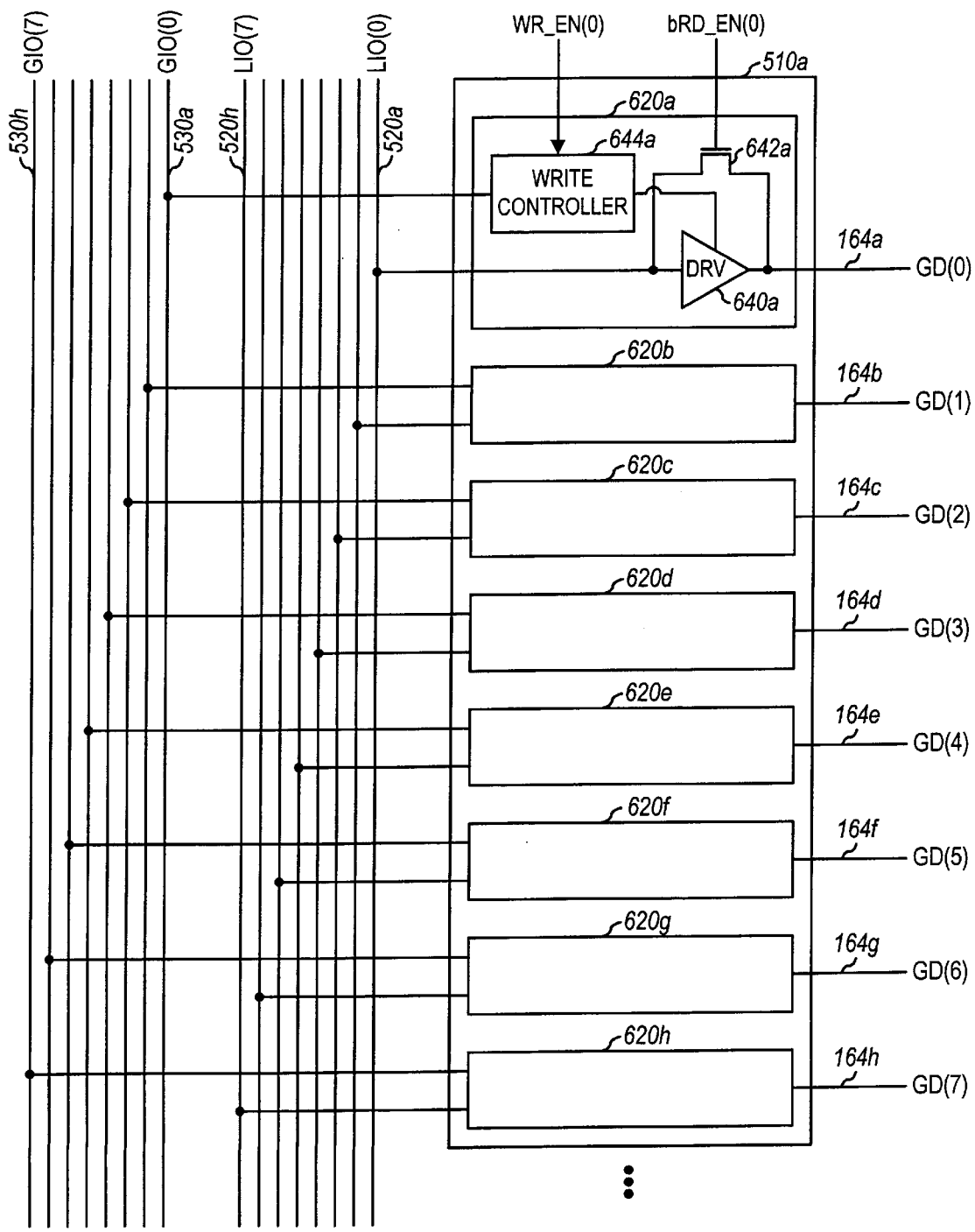
FIG. 7 shows a more detailed diagram of a multiplexer circuit and its interconnections with the local I/O lines and the global I/O lines.

As will be shown in detail below, each multiplexer circuit 510 includes a set of bi-directional multiplexers 620, one bi-directional multiplexers 620 for each global data line in the segment. In the specific embodiment, each multiplexer circuit 510 includes eight bidirectional multiplexers 620 for eight global data lines 164 in the segment. Each bi-directional multiplexer 620 couples to a respective local I/O line 520 (as shown in FIGS. 5 and 7). As shown in FIG. 6, within multiplexer circuit 510a, bi-directional multiplexers 620x couples to local I/O line 520x.

The datapath structure shown in FIG. 6 supports both data read from, and data write to, the memory cells. For a data write operation, the data bit at pad 180x is buffered by driver circuit 610x, provided through lines 182x and 530x, and latched by a data latch 630x within interface circuits 540x. The latched data bit is then buffered by a line driver (DRV) 632x that drives local I/O line 520x.

During the write operation, the bit read enable signal bRD_EN(x) is deactivated and the bit write enable signal bWR_EN(x) is activated. As the result, the data bit on line 520x is received and buffered by a driver (DRV) 640x within bi-directional multiplexer 620x. The buffered data bit is then provided on global data line 164x. The data bit on local I/O line 520x can also be received by other bi-directional multiplexers 620x (within other multiplexer circuits 510b through 5 10h) that also couple to local I/O line 520x. This allows a data bit on one I/O pad 180x to be written to multiple memory locations within memory device 100.

The control signal GD_S(x) for the particular memory array and the CSL(x) for the particular bit line are activated, thus turning on transistors 414x and 412x, respectively. The word line corresponding to the selected memory cell is also activated. This allows the data bit to be provided through global data line 164x, local data line 174x, and bit line 184x to the selected memory cell.

For a data read operation, the data bit in the selected memory cell is provided through lines 184x, 174x, and 164x to bi-directional multiplexer 620x. During the read operation, the bit read enable signal bRD_EN(x) is activated and the bit write enable signal bWR_EN(x) is deactivated. Thus, the data bit on global data line 164x is provided through a pass transistor 642x within the activated bi-directional multiplexer 620x to local I/O line 520x. The data bit on local I/O line 520x is received and buffered by a data sense amplifier (DSA) 634x within interface circuit 540x, and further buffered by a tri-statable buffer (BUF) 636x. The buffered data bit is provided through global I/O line 530x and pad line 182x to driver circuit 610x. Driver circuit 610x drives I/O pad 180x.

Referring back to FIG. 5, datapath 162 provides versatile interconnections between multiple I/O pads 180 and multiple memory cells in the memory arrays during read and write operations. For a data write operation, (up to) eight data bits from eight I/O pads 180 are provided to global I/O lines 530a through 530h. The data bits are buffered by eight interface circuits 540a through 540h, one interface circuit 540 coupled to each of the global I/O lines. The buffered data bits are provided to eight local I/O lines 520a through 520h. Local I/O lines 520 traverse through the length of datapath 162 and are coupled to all eight multiplexer circuits 510a through 51 Oh. Each data bit on a particular local I/O line 520 can be provided to eight different segments by properly activating the write enable signals WR_EN(0) through WR_EN(7) for multiplexer circuits 510a through 510h, respectively. Thus, eight data bits on eight local I/O lines 520 can be provided to eight different global data lines 164 in the same segment, or eight different global data lines 164 in eight different segments.

For a data read operation, (up to) eight data bits from eight memory cells in the same segment are provided to the same multiplexer circuit 510. Alternatively, eight data bits from eight memory cells in eight different segments can be provided to eight multiplexer circuits 510. The data bits are then routed through multiplexer circuits 510 and provided to eight local I/O lines 520. Eight data sense amplifiers 634 within eight interface circuits 540 buffer the data bits and provide the buffered data bits to eight global I/O lines 530. The buffered data bits are then provided to eight I/O pads 180 via eight pad lines 182.

FIG. 5 shows a diagram for one 8-segment datapath 162. As shown in FIG. 2, each datapath 160 includes two 8-segment datapaths 162. Further, as shown in FIG. 1, each memory device 100 includes two datapaths 160a and 160b. Thus, in this specific embodiment, memory device 100 can provide concurrent access of (up to) 32 data bits through 32 I/O pads 180.

Datapath 162 and other aspects of the invention provide many advantages. First, the datapath architecture of the invention supports concurrent read and write of multiple data bits from and to multiple memory cells. The datapath architecture supports normal write (of one data bit from each of the I/O pads to one memory cell) and block write (of multiple data bits to multiple memory cells) operations.

Second, the datapath and segmented memory array architectures of the invention provide normal and block write capabilities with minimal, if any, degradation in performance. As shown in FIGS. 4 and 5, each of the data bits during a block write is provided to one global data line 164 and one local data line 174. A data bit during a normal write is also provided to one global data line 164 and one local data line 174. Thus, each data bit during a block write experiences similar parasitic loading as that of a data bit during a normal write. Accordingly, the write drivers for block write can be sized similarly as the write drivers for normal write.

Third, the design of datapath 162 is modularized for layout efficiency and ease of implementation. Each segment is associated with one multiplexer circuit 510 and one interface circuit 540. Each segment is also associated with two additional buses that interconnect multiplexer circuit 510 to local I/O bus 520 and global I/O bus 530. The circuits and buses associated with each segment can be compactly laid out and replicated as many times as needed for the memory device. For the specific embodiment described herein, the circuits and buses are replicated 32 times (16 for memory block 110a and 16 times for memory block 110b). The modular design of datapath 162 simplifies the layout design, shorten the design time, and can also reduce the required layout area.

Fourth, the use of local I/O bus 520 provides interconnection flexibility while reducing the required circuitry. As an example, local I/O bus 520 allows up to eight data bits from the same multiplexer circuit 510, or from different multiplexer circuits 510, to be coupled to eight different global I/O lines 530 and eventually to eight different I/O pads 180. Further, through the use of local I/O bus 520, only one interface circuit 540 is needed for each accessed data bit. The eight interface circuits 540 are evenly distributed, one to each of the eight segments.

Fifth, datapath 162 can provide two data bits within one clock cycle (i.e., for double data rate (DDR) operation). Datapath 162 includes the support circuitry and interconnections to allow access to memory cells within memory block 110 on both edges of a clock signal for DDR operation.

And sixth, segmentation of the column lines results in fewer numbers of active columns in each segment during block write operations. Correspondingly, the amount of power conducted by the power bus within the memory device is less during the block write operation. Lower power can translate to smaller die size for the memory device.

FIG. 7 shows a more detailed diagram of multiplexer circuit 510a and its connections with local I/O bus 520 and global I/O bus 530. As shown in FIG. 7, multiplexer circuit 510a includes a set of eight bi-directional multiplexers 620a through 620h, or one bi-directional multiplexer 620 for each global data line in a segment. Within each bidirectional multiplexer 620, driver 640 couples to a respective local I/O line 520 and to a respective global data line 164. During a write operation, driver 640 buffers the data bit on local I/O line 520 and drives global data line 164. Pass transistor 642 couples in parallel with driver 640. During a read operation, transistor 642 couples the data bit on global data line 164 to local I/O line 520.

In an embodiment, all pass transistors 642 within the same multiplexer circuit 510 are coupled to the same bit read enable signal bRD_EN0 associated with the segment supported by that multiplexer circuit. As shown in FIG. 5, multiplexer circuit 510a receives the bit read enable signal bRD_EN(0), multiplexer circuit 510b receives the bit read enable signal bRD_EN(1), and so on. Based on the bit read enable signal bRD_EN, all pass transistors 642 within multiplexer circuit 510 are either activated or deactivated. For additional flexibility, each pass transistor 642 within multiplexer circuit 510 can receive an independent read enable signal that controls only that pass transistor.

In an embodiment, each bidirectional multiplexer 620 also includes a write controller 644 that provides the bit write enable signal bWR_EN( ) to driver 640. In an embodiment, all write controllers 644 within the same multiplexer circuit 510 receive the same write control signal WR_EN( ) associated with the segment supported by that multiplexer circuit. As shown in FIG. 5, multiplexer circuit 510a receives the write control signal WR_EN(0), multiplexer circuit 510b receives the write control signal WR_EN(1), and so on. Each write controller 644 within the same multiplexer circuit 510 also couples to a respective global I/O line 530. Based on the input from global I/O line 530 and the write control signal WR_EN( ), each write controller 644 generates a bit write enable signal bWR_EN( ) that either activates or deactivates the associated driver 640.

During a block write operation, the masking information is provided on I/O pads 180, through global I/O lines 530, and to write controllers 644 of (all) multiplexer circuits 510. Based on the write control signal WR_EN( ) for a particular multiplexer circuit 510 and the received masking information, selected ones of drivers 640 are activated. The data bits to be written to the memory array are provide by a register coupled to local I/O lines 520 (not shown in FIG. 7).

Figure 8:
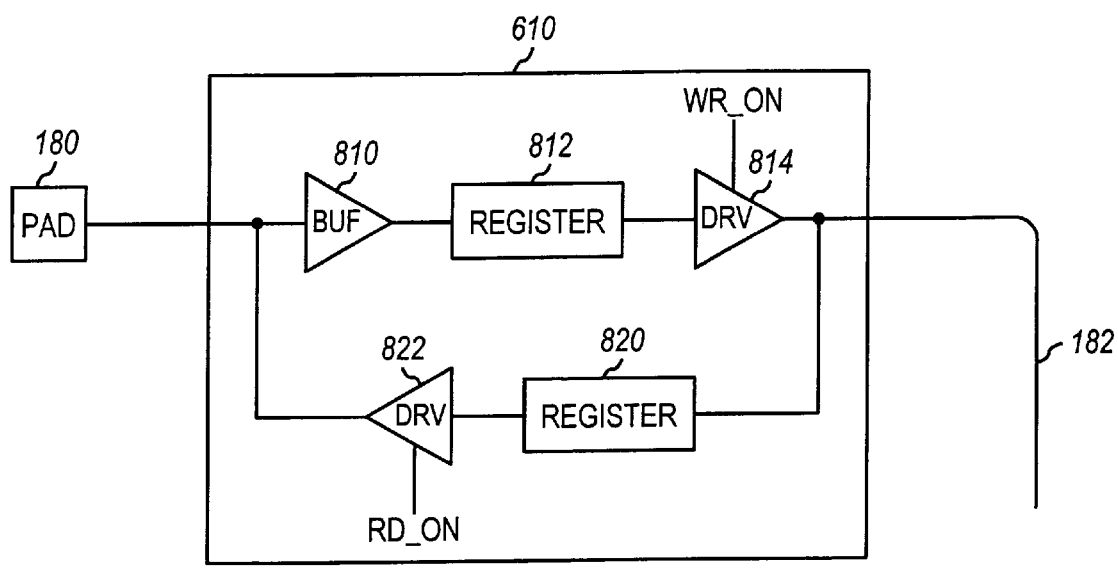
FIG. 8 shows a diagram of an embodiment of a driver circuit that buffers and drives the signal on the device I/O pad.

FIG. 8 shows a diagram of an embodiment of driver circuit 610 that buffers and drives the I/O pad. For improved performance, driver circuit 610 is located close to the I/O pad being supported. For a write operation, the data bit or masking information on I/O pad 180 is provided to a buffer (BUF) 810 within driver circuit 610. Buffer 810 buffers the received signal and provides the buffered signal to a register 812. Register 812 latches the signal and provides the latched data to a driver 814. Driver 814 drives a particular pad line 182 coupled to the driver circuit. For a read operation, the data bit on pad line 182 is provided to a register 820 within driver circuit 610. Register 820 latches the data bit and provides the latched data to a driver 822. Driver 822 drives I/O pad 180. Drivers 814 and 822 are tri-statable drivers controlled by the output write enable signal WR_ON and the output read enable signal RD_ON, respectively. To avoid contention on pad line 182 and I/O pad 180, either driver 814 or 822 (or none) is enable at any given moment.

In an embodiment, driver circuit 610 is designed such that only one signal line (e.g., pad line 182) is needed to interconnect driver circuit 610 with its associated global I/O line 530. This reduces the number of interconnections between driver circuit 610 and datapath 160. Also, in an embodiment, the support circuitry for driver circuit 610 is also implemented near the driver circuit.

Although the invention is described for a specific embodiment, alternative implementations of the invention and modifications of the architectures described herein can be made. For example, each sense amplifier array can be partitioned into greater or fewer number of segments than sixteen. Further, each segment of each sense amplifier array can be associated with greater or fewer number of local data lines than two. Thus, the specific implementation details are intended to be illustrative, and not limitations, of the present invention.

The architectures described herein can support single data rate (SDR) operation as well as double data rate (DDR) operation. A more detail discussion of operating a segmented memory array in DDR operation is included in the aforementioned U.S. patent application Ser. Nos. 09/195,269 and 09/235,222. The general inventive concepts can be extended to concurrent memory access of any number of data bits. For example, the architectures described herein can be modified to support a quadruple data rate operation, an octal data rate operation, or a Q data rate operation (where Q is any integer greater than one).

In multi-data rate operation, prefetch operations are normally performed for a memory read. The prefetch operation retrieves multiple bits from memory from one memory address. For example, a memory device can be designed to prefetch the data bits at addresses (ADDR) and (ADDR+1) for a DDR read operation. The architectures of the invention advantageously support prefetch operations. For example, the I/O lines used for block write operations can also be used for prefetch of multiple data bits during read operations.

The architectures described herein can be implemented within a stand-alone integrated circuit (IC) such as, for example, a dynamic random access memory (DRAM) IC, a synchronous graphics RAM (SGRAM), and other memory devices. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, central processing unit (CPU).

The previous description of the specific embodiments is provided to enable any person skilled in the art to make or use the invention. The various modifications to these embodiments will be readily apparent to those skilled in the art, and the generic principles defined herein may be applied to other embodiments without the use of the inventive faculty. Thus, the invention is not intended to be limited to the embodiments shown herein but is to be accorded the widest scope consistent with the principles and novel features disclosed herein, and as defined by the following claims.

What is claimed is:

1. An interconnection structure for an integrated circuit that includes at least one memory array, wherein each memory array is partitioned into a plurality of segments, and wherein each segment is associated with at least one bit line, the structure comprising:

N local data lines associated with each memory array, wherein at least one local data line is associated with each segment of the memory array, and wherein each local data line operatively couples to one or more of the at least one bit line;

N global data lines operatively coupled to the N local data lines of each of the at least one memory array;

M global I/O lines; and datapath coupled to the M global I/O lines and the N global data lines, wherein the datapath includes a plurality of multiplexer circuits operative to selectively interconnect the M global I/O lines to the N global data lines in accordance with a set of control signals.

2. An interconnection structure for an integrated circuit that includes at least one memory array, wherein each memory array is partitioned into a plurality of segments, wherein each segment is associated with at least one bit line and 2L local data lines, wherein L local data lines are located on one side of the memory array and L local data lines are located on the other side of the memory array, and wherein bit lines associated with a first set of I/O pads are coupled to the L local data lines on one side and bit lines associated with a second set of I/O pads are coupled to the L local data lines on the other side, the structure comprising:

N local data lines associated with each memory array, wherein at least one local data line is associated with each segment of the memory array, and wherein each local data line operatively couples to one or more of the at least one bit line;

N global data lines operatively coupled to the N local data lines of each of the at least one memory array;

M global I/O lines; and a datapath coupled to the M global I/O lines and the N global data lines and operative to selectively interconnect the M global I/O lines to the N global data lines in accordance with a set of control signals.

3. An interconnection structure for an integrated circuit that includes at least one memory array, wherein each memory array is partitioned into a plurality of segments, and wherein each segment is associated with at least one bit line, the structure comprising:

N local data lines associated with each memory array, wherein at least one local data line is associated with each segment of the memory array, and wherein each local data line operatively couples to one or more of the at least one bit line;

N global data lines operatively coupled to the N local data lines of each of the at least one memory array;

M global I/O lines;

M local I/O lines operatively coupled to the M global I/O lines and further operatively coupled to the N global data lines; and a datapath operative to selectively interconnect the M global I/O lines to the N global data lines in accordance with a set of control signals.

4. The structure of claim 3, wherein the datapath comprises:

M interface circuits coupled to the M global I/O lines and the M local I/O lines, wherein each interface circuit provides buffering and signal drive for a respective set of global I/O line and local I/O line.

5. The structure of claim 3, wherein the M local I/O lines are local to the datapath.

6. The structure of claim 3, wherein each memory array is partitioned into at least sixteen segments.

7. The structure of claim 3, wherein each segment is associated with at least four local data lines.

8. The structure of claim 3, wherein M is at least eight.

9. The structure of claim 3, wherein M is at least 32.

10. The structure of claim 3, wherein N is at least 64.

11. A dynamic random access memory (DRAM) device comprising the interconnection structure of claim 3.

12. A synchronous graphics random access memory (SGRAM) comprising the interconnection structure of claim 3.

13. An integrated circuit comprising an embedded memory array coupled to the interconnection structure of claim 3.

14. The structure of claim 3, wherein the M global I/O lines support a prefetch of up to M data bits during a prefetch operation.

15. The structure of claim 14, wherein the M global I/O lines support a prefetch of two data bits during a prefetch operation.

16. The structure of claim 3, wherein the datapath comprises:

M multiplexer circuits coupled to the M local I/O lines and the N global data lines and operative to selectively interconnect the N global data lines to the M local I/O lines in accordance with the set of control signals.

17. The structure of claim 16, wherein the M multiplexer circuits further couple to the M global I/O lines for receiving masking information during a block write operation.

18. The structure of claim 16, wherein each of the M multiplexer circuits comprises:

N/M bi-directional multiplexers, each bi-directional multiplexer operative to interconnect a respective set of local I/O line and global data line.

19. The structure of claim 18, wherein each bi-directional multiplexer comprises:

a write driver that provides buffering and signal drive during a write operation.

20. The structure of claim 18, wherein each bi-directional multiplexer comprises:

a pass transistor that couples an activated global data line to one of the M local I/O lines.

21. An integrated circuit comprising:

at least one memory array, wherein each memory array is partitioned into a plurality of segments, wherein each segment is associated with
at least one bit line, and
at least one local data line operatively coupled to the at least one bit lines;

a plurality of global data lines operatively coupled to the local data lines associated with the plurality of segments;

a plurality of global I/O lines; and a plurality of multiplexer circuits coupled to the plurality of global I/O lines and the plurality of global data lines and operative to selectively interconnect the plurality of global I/O lines to the plurality of global data lines in accordance with a set of control signals.

22. An integrated circuit comprising:

K memory arrays, wherein each memory array is partitioned into S segments, and wherein each segment is associated with a plurality of bit lines;

N local data lines for each memory array, wherein at least one local data line is associated with each segment of each memory array, wherein each local data line operatively couples to the bit lines associated with that local data line;

N global data lines operatively coupled to the N local data lines of each of the K memory arrays;

M global I/O lines; and a datapath coupled to the M global I/O lines and the N global data lines, wherein the datapath includes M local I/O lines operatively coupled to the M global I/O lines, and M multiplexer circuits, each of the M multiplexer circuits interposed between the M local I/O lines and N/M of the N global data lines, wherein the M multiplexer circuits multiplexes the M global I/O lines to the N global data lines in accordance with a set of control signals.

23. The integrated circuit of claim 22, wherein M is at least 8.

24. The integrated circuit of claim 22, wherein N is at least 64.

25. The integrated circuit of claim 22, wherein each of the M multiplexer circuits comprises:

a plurality of bi-directional multiplexers, each bi-directional multiplexer operative to interconnect a respective set of global I/O line and global data line.

26. The integrated circuit of claim 25, wherein each bi-directional multiplexer comprises:

a write driver that provides buffering and signal drive during a write operation.

27. The integrated circuit of claim 25, wherein each bi-directional multiplexer comprises:

a pass transistor that couples an activated global data line to one of the M global I/O lines.

28. An interconnection structure for an integrated circuit that includes at least one memory array, wherein each memory array is associated with a plurality of bit lines, the structure comprising:

a plurality of global data lines operatively coupled to the plurality of bit lines;

a plurality of global I/O lines;

a plurality of local I/O lines operatively coupled to the plurality of global I/O lines; and a plurality of multiplexer circuits operative to selectively interconnect the plurality of local I/O lines to the plurality of global data lines.

29. The interconnection structure of claim 28, wherein each multiplexer circuit operatively couples the plurality of local I/O lines to a respective set of global data lines.

30. The interconnection structure of claim 28, wherein the plurality of multiplexer circuits further couple to the plurality of global I/O lines for receiving masking information during a block write operation.

31. The interconnection structure of claim 28, further comprising:

a plurality of interface circuits operatively coupled to the plurality of local I/O lines and the plurality of global I/O lines.

32. The interconnection structure of claim 28, wherein each memory array is partitioned into a plurality of segments, wherein the plurality of global data lines are arranged into a plurality of sets, and wherein one set of global data lines is associated with one segment of each memory array.

33. The interconnection structure of claim 28, further comprising:

a plurality of local data lines operatively coupled to the plurality of global data lines and the plurality of bit lines.

* * * * *